(12) United States Patent
Haparnas

(10) Patent No.: US 7,392,066 B2
(45) Date of Patent: Jun. 24, 2008

(54) VOLUME CONTROL SYSTEM AND METHOD FOR A MOBILE COMMUNICATION DEVICE

(75) Inventor: Ziv Haparnas, San Francisco, CA (US)

(73) Assignee: IXI Mobile (R&D), Ltd. (IL)

( * ) Notice: Subject to any disclaimer, the term of this patent is extended or adjusted under 35 U.S.C. 154(b) by 186 days.

(21) Appl. No.: 10/872,170

(22) Filed: Jun. 17, 2004

(65) Prior Publication Data
US 2005/0282590 A1    Dec. 22, 2005

(51) Int. Cl.
*H04B 1/38* (2006.01)
(52) U.S. Cl. .............. 455/567; 379/373.01; 379/373.02; 379/376.02
(58) Field of Classification Search .............. 455/550.1, 455/567, 569.1; 379/418, 420.01, 420.02, 379/373.01, 373.02, 373.03, 376.02
See application file for complete search history.

(56) References Cited

U.S. PATENT DOCUMENTS 6,246,761 B1 * 6/2001 Cuddy ........................ 379/418
6,834,107 B1 * 12/2004 Hurst .................... 379/390.01
7,024,229 B2 * 4/2006 Nishimura .................. 455/567

FOREIGN PATENT DOCUMENTS

EP          507482 A2 *  10/1992

* cited by examiner

*Primary Examiner*—Edward F. Urban
*Assistant Examiner*—Raymond S. Dean
(74) *Attorney, Agent, or Firm*—Century IP Group, Inc.; F. Jason Far-hadian, Esq.

(57) ABSTRACT

In accordance with one or more embodiments, a method for adjusting volume of a mobile device in relationship to environment noise is provided. The method comprises sampling ambient noise around the mobile device to obtain at least one audio sample; measuring volume of the at least one audio sample to determine volume of the ambient noise; increasing the volume of the mobile device, when the volume of the ambient noise is greater than a first threshold value; and decreasing the volume of the mobile device, when the volume of the ambient noise is less than a second threshold value.

17 Claims, 5 Drawing Sheets

VOLUME CONTROL SYSTEM AND METHOD FOR A MOBILE COMMUNICATION DEVICE

BACKGROUND

Field of Invention

The present invention relates generally to a volume control system for a mobile communication device and, more particularly, to controlling the audio volume of the speaker of a mobile communication device in accordance to environment noise level.

Copyright & Trademark Notices

A portion of the disclosure of this patent document contains material, which is subject to copyright protection. The owner has no objection to the facsimile reproduction by any one of the patent document or the patent disclosure, as it appears in the Patent and Trademark Office patent file or records, but otherwise reserves all copyrights whatsoever.

Certain marks referenced herein may be common law or registered trademarks of third parties affiliated or unaffiliated with the applicant or the assignee. Use of these marks is for providing an enabling disclosure by way of example and shall not be construed to limit the scope of this invention to material associated with such marks.

Related Art

Mobile communication devices are used in many different environments, due to their portable nature. The noise level can greatly vary from one environment to the next, depending on the respective time and location. For example, the environment noise level at a construction site is typically higher than the noise level at the user's office. Also, the noise level can change depending on the number of people or equipments in the user's immediate environment.

In a noisy environment, a user typically has to manually set the ring tone or speaker volume at a louder level than normal, so that the user can better hear the ring tone or the speaker. If the user forgets to do this, then the user may miss a call. Or when he answers the call, the user will have to manually adjust the speaker volume so that the user can hear the caller's voice.

In a quiet environment, a user will have to manually set the ring tone or the speaker volume at a quieter level than normal, so that the ring or the speaker volume would not disturb others in close vicinity, or the user's ear. Some prior art systems have predetermined audio levels for a mobile phone ringer, such that the volume can be set to a "meeting mode", for example. This causes the phone to only vibrate or ring at a quiet level to respect the quiet setting of the environment.

Unfortunately, none of the prior art systems or methods provides a solution to the incessant burden that requires a user to adjust the volume each time the environment around the user changes. Particularly, a user will have to remember to adjust the ring or speaker volume with respect to the environment noise level, each time the user is positioned in a louder or a quieter setting than before.

One can appreciate that for users with versatile lifestyles, the above-mentioned burden can be demanding and unpleasant. Many mobile phone users have experienced missed telephone calls because they have forgotten to increase the ringer volume after the ambient noise level has suddenly increased; and many more users have been startled by the loud volume of the phone's speaker or ringer after a sudden decrease in the ambient noise level.

Systems and methods are needed to overcome the above shortcomings by automatically adjusting the ringer or speaker volume of a mobile device in accordance with the ambient noise level.

SUMMARY

The present disclosure is directed to a system and corresponding methods for controlling a mobile device's ringer or speaker volume based on the surrounding environment's noise level.

For the purpose of summarizing, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested.

In accordance with one or more embodiments, a method for adjusting volume of a mobile device in relationship to environment noise is provided. The method comprises sampling ambient noise around the mobile device to obtain at least one audio sample; measuring volume of the at least one audio sample to determine volume of the ambient noise; increasing the volume of the mobile device, when the volume of the ambient noise is greater than a first threshold value; and decreasing the volume of the mobile device, when the volume of the ambient noise is less than a second threshold value.

The first threshold value represents a first volume beyond which it would be difficult for a user to hear an audio output produced by the mobile device in a first environment. The second threshold value represents a second volume above which it would be inappropriate for an audio output of the mobile device to be produced in a second environment.

The volume of the mobile device is produced by an external speaker of the mobile device, in one embodiment. The volume of the mobile device is produced by a ringer of the mobile device when an incoming call is received by the mobile device in another embodiment. The volume of the mobile device may be produced by a speaker of the mobile device designated for producing audio signals communicated to the mobile device in yet another embodiment.

In certain embodiments, the sampling is performed prior to mobile device receiving an incoming call, or after mobile device receives an incoming call and before a ring tone is generated by the mobile device. In other embodiments, the sampling is performed after the mobile device generates a ring tone. In such embodiment, volume of the ring tone is measured first, and then the volume of the ambient noise is determined by reducing the measured volume of the at least one audio sample by the volume of the ring tone.

In accordance with yet another embodiment of the invention, the sampling comprises multiple sampling steps at predetermined time intervals to obtain a plurality of audio samples for the ambient noise. As such, the volume of the ambient noise is determined based-on the plurality of audio samples obtained, such that the volume of the ambient noise is determined as an average of volumes of the plurality of audio samples obtained.

In one embodiment a system for adjusting ring volume of a mobile device is provided. The system comprises a microphone for obtaining at least one audio sample of ambient noise around the mobile device; a volume sensor for measuring volume of the at least one audio sample to determine volume of the ambient noise; and a control mechanism for increasing ring volume of the mobile device, when the volume of the ambient noise is greater than a first threshold value, and for decreasing the ring volume of the mobile device, when the volume of the ambient noise is less than a second threshold value.

In another embodiment, a system for adjusting speaker volume of a mobile device is provided. The system comprises a microphone for obtaining at least one audio sample of ambient noise around the mobile device; a volume sensor for measuring volume of the at least one audio sample to determine volume of the ambient noise; and a control mechanism for increasing speaker volume of the mobile device, when the volume of the ambient noise is greater than a first threshold value, and for decreasing the speaker volume of the mobile device, when the volume of the ambient noise is less than a second threshold value.

These and other embodiments of the present invention will also become readily apparent to those skilled in the art from the following detailed description of the embodiments having reference to the attached figures, the invention not being limited to any particular embodiments disclosed.

BRIEF DESCRIPTION OF THE DRAWINGS

Embodiments of the present invention are understood by referring to the figures in the attached drawings, as provided below.

Features, elements, and aspects of the invention that are referenced by the same numerals in different figures represent the same, equivalent, or similar features, elements, or aspects, in accordance with one or more embodiments.

DETAILED DESCRIPTION

A system and corresponding methods, according to an embodiment of the present invention, facilitate the operation and provide a control system for adjusting the speaker or ringer volume of a mobile communication device in relation to the ambient noise level.

Numerous specific details are set forth to provide a thorough description of various embodiments of the invention. Certain embodiments of the invention may be practiced without these specific details or with some variations in detail.

Figure 1:
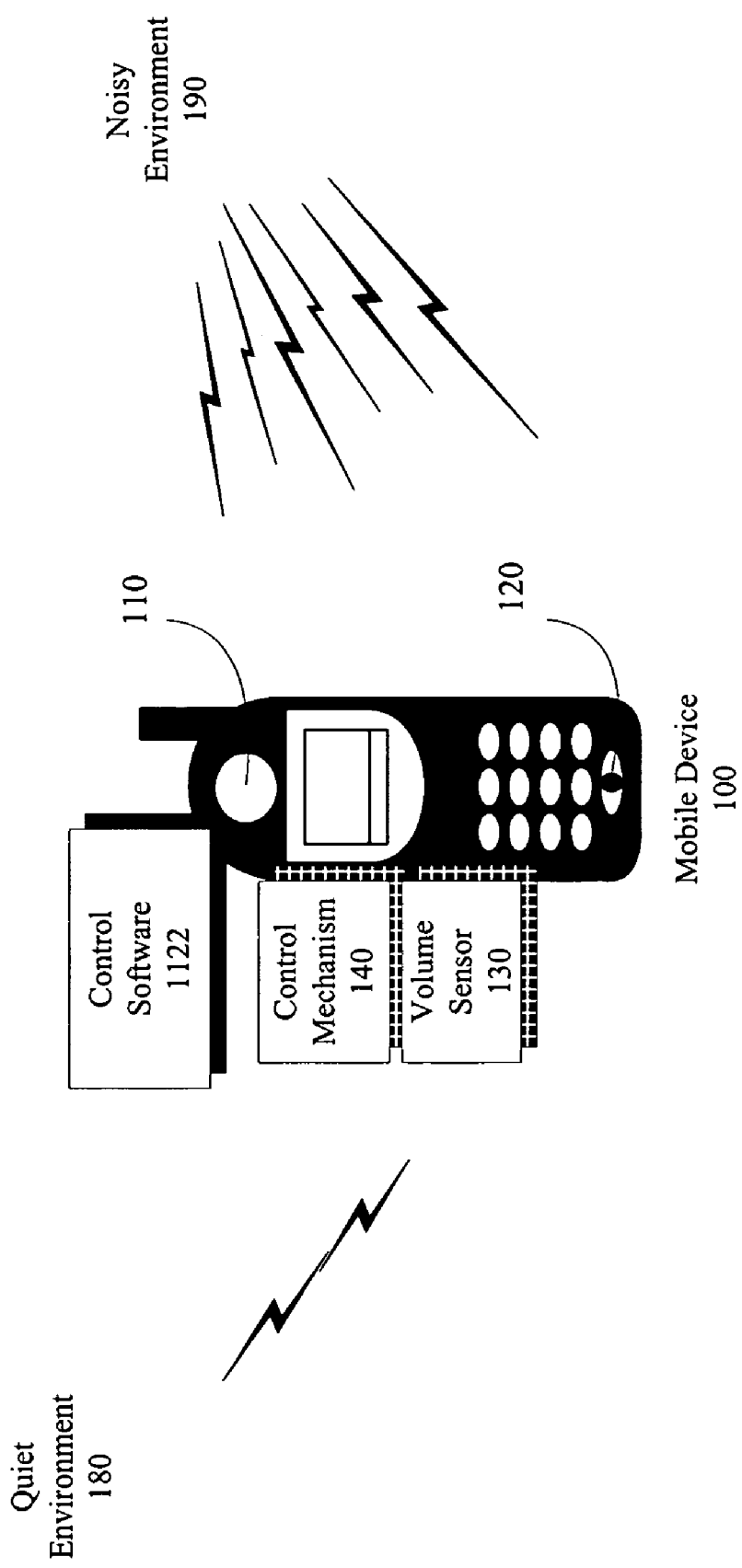
FIG. 1 illustrates an exemplary environment in which a volume control mechanism may be utilized, in accordance with one embodiment of the invention.

Referring to FIG. 1, in one or more embodiments of the invention, a mobile device 100 is illustrated in an environment that is susceptible to changes in ambient noise level. For example, as shown, in an outdoor setting, mobile device 100 may be exposed to a noisy environment 190. In such a setting, the user preference would be to increase the ringer or speaker volume of mobile device 100 so that he can better hear the audio output generated by mobile device 100. In an indoor setting, for example, mobile device 100 may be positioned in a quiet environment 180. Thus, the user would prefer to decrease the ringer or speaker volume not to disturb the environment's serenity.

As such, in accordance with one embodiment, mobile device 100 comprises a volume sensor 130 that measures the ambient noise level so that mobile device 100's speaker or ringer volume can be adjusted accordingly. Mobile device 100 further comprises one or more user interface components, such as a speaker 110 and a microphone 120. Speaker 110 generates audio output to notify a user of an incoming call by producing an audible alert ring, for example. In certain embodiments, speaker 110 is exclusively coupled to a ring generating mechanism (not shown) to produce the alert ring. In other embodiments, speaker 110 functions to output the voice of a caller as well as the ring tone when a call is received.

Mobile device 100 further comprises a volume control mechanism 140. Volume control mechanism 140 increases or decreases speaker 110's volume in accordance with a instructions provided by a user manually interacting with mobile device 100's control interfaces, or in conformity with instructions provided by control software 1122 executed on mobile device 120, for example. Control software 1122 controls operation of volume control mechanism 140 based on control signals received from volume sensor 130, as provided in further detail below.

In the following, control software 1122 and the respective control mechanism 140 are described as applicable to functions related to adjusting the volume of speaker 110 embedded in mobile device 100. It should be noted, however, that the specific application provided here is by way of example. That is, control software 1122 and the respective control mechanism 140 can be used to control the volume of any other audio mechanism (e.g., ringer, external speaker, etc.) embedded in, connected, or otherwise coupled to mobile device 100.

The terms "connected," "coupled," or any variant thereof, mean any connection or coupling, either direct or indirect, between two or more elements. The coupling or connection between the elements can be physical, logical, or a combination thereof. Further, one of ordinary skill in the art will appreciate that mobile device 100, in accordance with one embodiment, may be connected to one or more types of networks (e.g., personal area networks (PANs), local area networks (LANs), cellular communications networks, personal mobile gateways (PMGs), etc.) without limiting the scope of the invention.

Mobile device 100, in one or more embodiments, can be a cellular phone, a cordless phone, a personal digital assistance (PDA), a laptop computer, a desktop computer, or other computing or processing machine capable of data storage and data communication, for example. In one embodiment, mobile device 100 may comprise one or more means of wireless communications. Wireless communication technologies suited for connecting wireless devices in short-range area networks (e.g., IEEE 802.11 or Bluetooth), and long-range area networks (e.g., GSM) and the like may be utilized to connect mobile device 100 to other mobile devices or wireless infrastructure components, for example.

As used herein, the terms mobile device, cellular phone and communications network are to be viewed as designations of one or more computing environments that comprise application, client or server software for servicing requests submitted by respective software included in devices or other computing systems connected thereto. These terms are not to be otherwise limiting in any manner. Control software 1122, for example, may be comprised of one or more modules that execute on one or more computing systems, as provided in further detail below.

Furthermore, in one or more embodiments, speaker 110, microphone 120, volume sensor 130 and control mechanism 140 are embedded in the same electrical module. Alternatively, each of said devices either individually or in combination may comprise one or more electrical modules or components that operate to send or receive control signals to a microcontroller in accordance with instructions dictated by control software 1122.

The reference to speaker 110, microphone 120, volume sensor 130 and control mechanism 140 is made in the singular form, through out this disclosure. It is noteworthy, however, that in alternative embodiments any number of speakers 110, microphones 120, volume sensors 130 and control mechanisms 140, either alone or in combination, may be utilized depending on system implementation. For example, speaker 110 and control mechanism 140 may comprise other software or hardware modules, such as power amplifier, transistors, field effect transistors (FETs), etc. that can be used instead, in conjunction or in combination with volume sensor 130 to accomplish the same results.

Volume sensor 130 can be, for example, a transistor that is sensitive to changes in audio volume and intensity. In one embodiment, for example, volume sensor 210 is a thick-film acoustic wave sensor manufactured by PCB Piezotronics. Any other audio sensitive element that can be used to measure, detect or compare variations and attenuations in mobile device 100's ambient noise may be used instead or in addition to the above-named acoustic sensor. One skilled in the art would understand that various signal-processing modules may be utilized to perform the tasks of volume measurement, detection, and comparison in alternative embodiments of the invention.

Figure 2A:
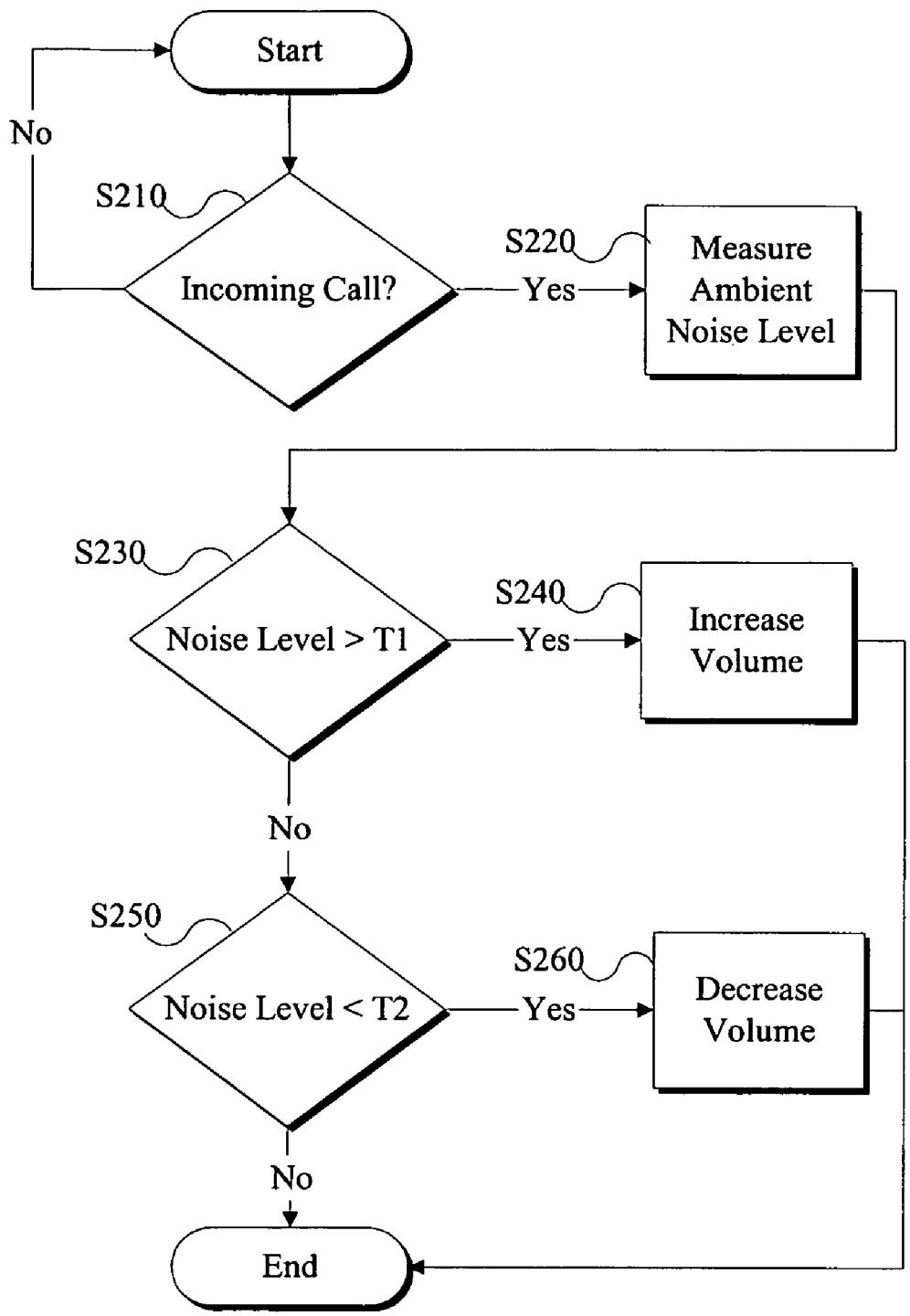
FIGS. 2A, 2B and 2C are flow diagrams of exemplary volume control methods, in accordance with one or more embodiments.

Referring to FIG. 2A, in a first exemplary embodiment, control software 1122 is executed on mobile device 100 to monitor incoming calls (S210). When an incoming call is received, control software 1122 activates microphone 120 to sample ambient noise around mobile device 100 for a predetermined period (e.g., for 0.5 seconds). Thus, microphone 120 receives an audio input comprising a sample of the noise in the surrounding environment.

In some embodiments, the audio input is stored in a permanent or temporary memory unit (e.g., ROM, RAM, etc.). The sample audio input is either directly or indirectly provided to volume sensor 130. Volume sensor 130 then measures the ambient noise level in accordance with the audio characteristics of the sample (S220). Volume sensor 130 then produces analog or digital signals that represent the ambient noise level.

In either case, control software 1122 in cooperation with one or more other software or hardware modules (e.g., converters, comparators, etc.) processes the signals generated by volume sensor 130 to determine if the measured noise level is greater than a first threshold T1 (S230). The first threshold T1 is set in accordance with a predetermined value provided either at the time of manufacturing or by the user of mobile device 100. In one embodiment, the value of the first threshold T1 represents a noise level volume beyond which a user would have a difficult time hearing the audio output of speaker 110 or the ring tone.

If the ambient noise level is greater than the first threshold T1, then control software 1122 causes a control signal to be generated by volume control mechanism 140 so as to increase the output volume of speaker 110 (S240). Depending on implementation, control software 1122 may determine the degree by which the measured ambient noise level is higher than the first threshold T1, so as to increase the speaker volume accordingly.

For example, if the ambient noise level is measured as being 5 decibels higher than the first threshold T1, then control software 1122 may cause the speaker volume to be increased by 10 decibels. In other embodiments, the speaker volume is increased by a predetermined value regardless of the degree of difference between the measured ambient noise level and the first threshold T1.

If the ambient noise level is not greater than the first threshold T1, then signals generated by volume sensor 130 are processed to determine, if the measured ambient noise is less than a second threshold T2 (S250). The value of the second threshold T2 can be set by the user or the manufacturer. T2, in one embodiment, represents an environment noise level which is so quiet that the default speaker volume of mobile device 100 would be considered inappropriately loud.

Therefore, if it is determined that the ambient noise level is below the second threshold T2, then control software 1122 causes control mechanism 140 to decrease the volume of speaker 110 or the ring tone. The decrease in volume would reduce the volume of audio output generate by speaker 110, preferably, to a degree that the user can still hear the audio output, without disrupting the serenity of the surrounding environment. For example, if the user walks into a classroom (i.e., a quiet environment) then the speaker volume would be adjusted automatically, so as to not startle the user or the class, when a call is received.

Depending on implementation, control software 1122 may determine the degree by which the measured ambient noise level is less than the second threshold T2, so as to decrease the speaker volume accordingly. For example, if the ambient noise level is measured as being 3 decibels less than the second threshold T2, then control software 1122 may cause the speaker volume to be decrease by 4 decibels.

A user may interact with mobile device 100 to set or adjust the degrees by which the volume is increase or decreased, in accordance with one embodiment. In other embodiments, the speaker volume is increase or decreased by a predetermined value regardless of the degree of difference between the measured noise level and the first or second thresholds, T1, T2.

If the measured ambient noise level is not less than the second threshold T2, then the surrounding noise level is approximately between the first and second thresholds T1 and T2 (i.e., T1>=ambient noise>=T2). Under this condition, control software 1122 maintains the speaker volume at the default volume level, and therefore no instructions are issued for increasing or decreasing the volume of speaker 110.

It is noteworthy that the instructions for increasing or decreasing the speaker volume can be applied to either the speaker that generates the ring tone for mobile device 100 (i.e., the external speaker or ringer) or the speaker that generates the audio output of the calling party's voice (i.e., internal speaker 110), or both. Throughout this specification, a reference may be made to one type of speaker without including the other. This, however, should not be construed as limiting the scope of the invention to the particular type of speaker.

One skilled in the art would understand that the volume control procedures provide herein can be applied to either of type of speaker or other audio output mechanisms connected or embedded in mobile device 100, either individually or collectively, depending on implementation. That is, either at the time of manufacture or according to user instructions, control mechanism 140 may be programmed to increase or decrease the volume of either the external speaker, or the internal speaker, or both, as provided above.

Figure 2B:
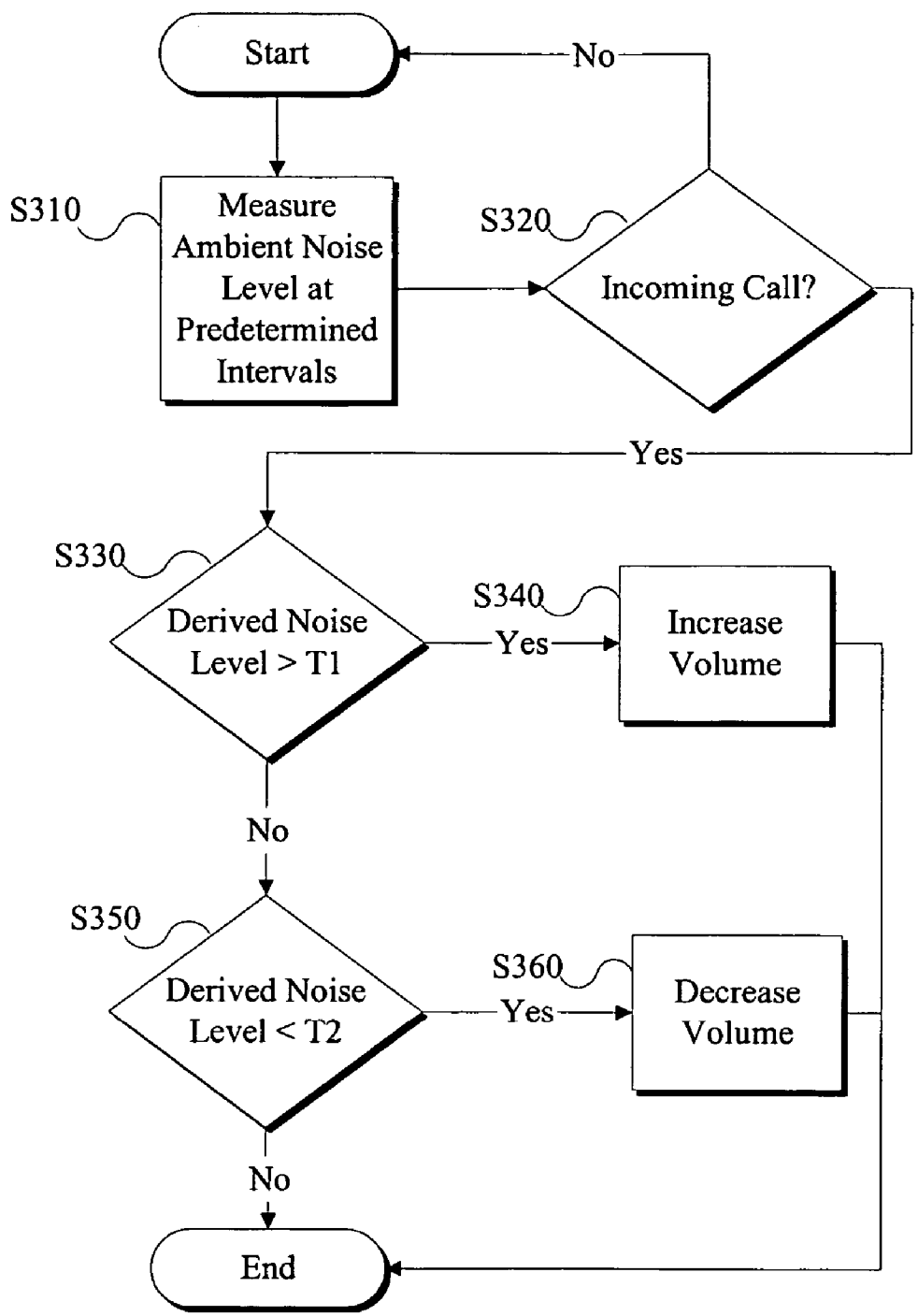

Referring to FIG. 2B, in a second exemplary embodiment, control software 1122 is executed on mobile device 100 to cause volume sensor 130 to measure the ambient noise level at predetermined time intervals (S310). To accomplish this, control software 1122 activates microphone 120 to sample ambient noise around mobile device 100, for example, every five seconds. The five-second samples are either individually or collectively provided to volume sensor 130. As such, microphone 120 receives multiple audio samples of ambient noise and volume sensor 130 measures each sample to determine the volume of each corresponding audio sample.

For example, values V1, V2, . . . , V10 would represent the ambient noise volume for ten audio samples taken at 10 different time intervals. Each audio sample can be, for example, 0.2 seconds long and values V1 through V10 may represent ambient noise volumes at 101 decibels to 110 decibels, for example. Depending on implementation, control software 1122 calculates a derivative noise level based on the multiple volume measurements for the audio samples received.

For example, in one embodiment, the average or median noise level is determined by applying an average or median function to the last six volume measurements (e.g., V5 through V10). One skilled in the pertinent art would appreciate that the derived noise level can be calculated based on a variety of methods that may be more sophisticated than the exemplary methods disclosed here. Thus, the scope of the invention should not be construed as limited to the average or median functions discussed herein.

In accordance with one embodiment, while the audio samples are measured at the predetermined time intervals, control software 1122 monitors incoming calls (S320). When an incoming call is received, control software 1122 determines the volume of the ambient noise derived from the multiple sets of values measured in accordance with one of the methods provided earlier (e.g., average value, median value, etc.). The derived noise level is then compared with the first and second thresholds T1 and T2 to determine if the speaker volume is to be increased or decreased in a similar manner as discussed with respect to FIG. 2A (S330 through S360).

Figure 2C:
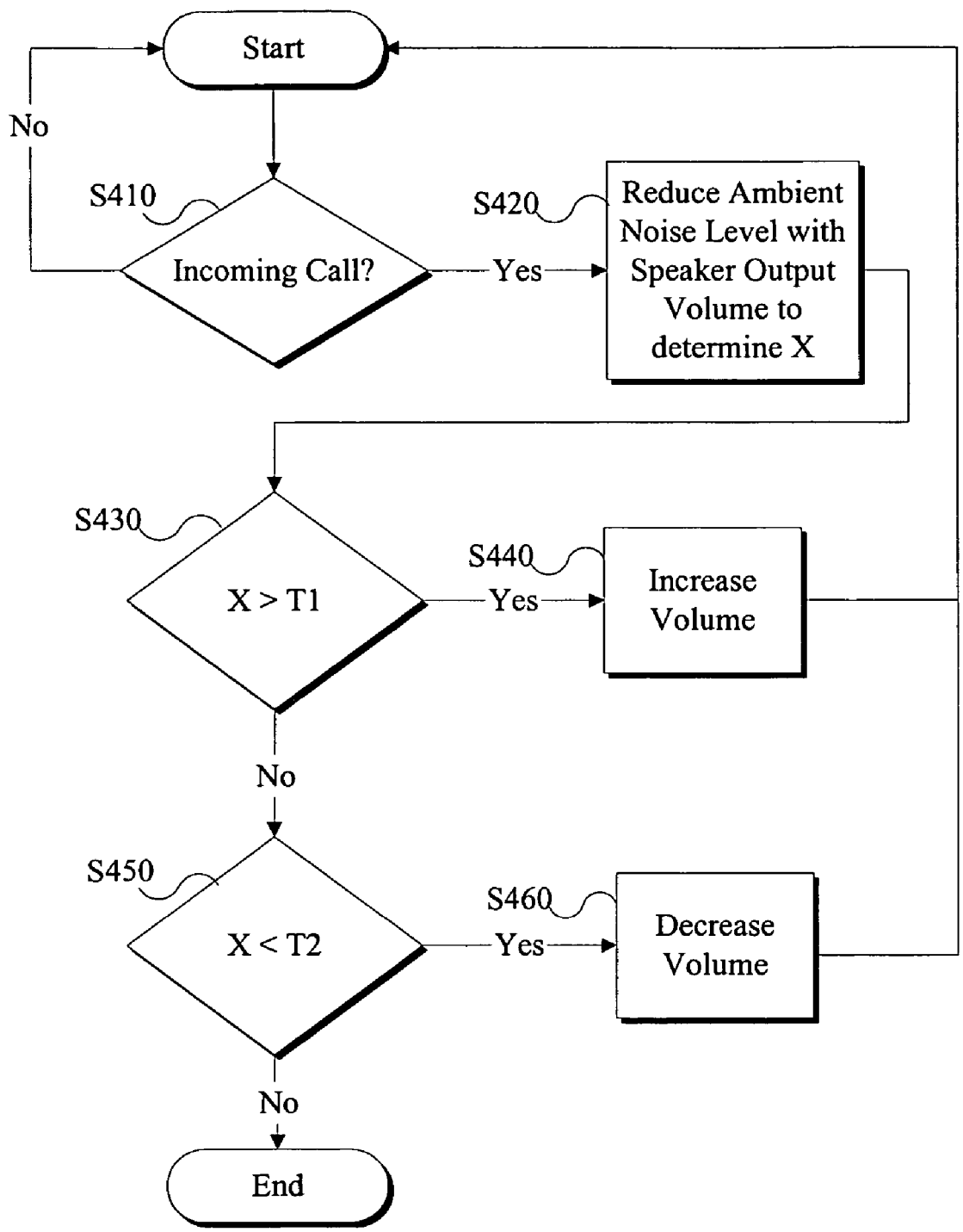

In the above two exemplary embodiments disclosed with reference to FIGS. 2A and 2B, the ambient noise level is calculated based on measurements of audio samples taken, preferably, prior to a ring tone being produced as a result of mobile device 100 receiving an incoming call. Referring to FIG. 2C, in accordance with another exemplary method, the value for the ambient noise level is calculated while mobile device 100 is ringing. As such, the ambient noise volume is calculated in relationship to the volume of the ring tone produced by mobile device 100 as provided below.

Accordingly, when an incoming call is received (S410), control software 1122 instructs microphone 120 to take an audio sample of the ambient noise. Since ambient noise also includes the ring tone generated by the speaker of mobile device 100, the ambient noise volume is reduced by the speaker volume (S420) to determine a value X, for example. This implementation allows mobile device 100 to start ringing as soon as a call is received. Thus, no delay would be imposed for the purpose of measuring the ambient noise prior to the ring tone being generated.

The value of X is then compared with the first and second thresholds T1 and T2 to determine if the speaker volume is to be increased or decreased as provided earlier with respect to FIGS. 2A and 2B. That is, if the ambient noise level represented by X is determined to be greater than the first threshold T1, then the speaker volume is increased, and if X is determined to be less than the second threshold T2, then the speaker volume is decreased. Otherwise, the speaker volume remains unchanged.

One skilled in the pertinent are would appreciate that the exemplary methods discussed with reference to FIGS. 2A, 2B and 2C may be implemented either separately or in combination with one another. For example, control software 1122 may instruct microphone 120 to sample audio inputs at multiple time intervals both before and after an incoming call is received, or both before and after a ring tone is produced by mobile device 100. Thus, even though each exemplary embodiment is discussed individually, the scope of the invention should not be construed to include the provided methods exclusive of one another.

Figure 3A:
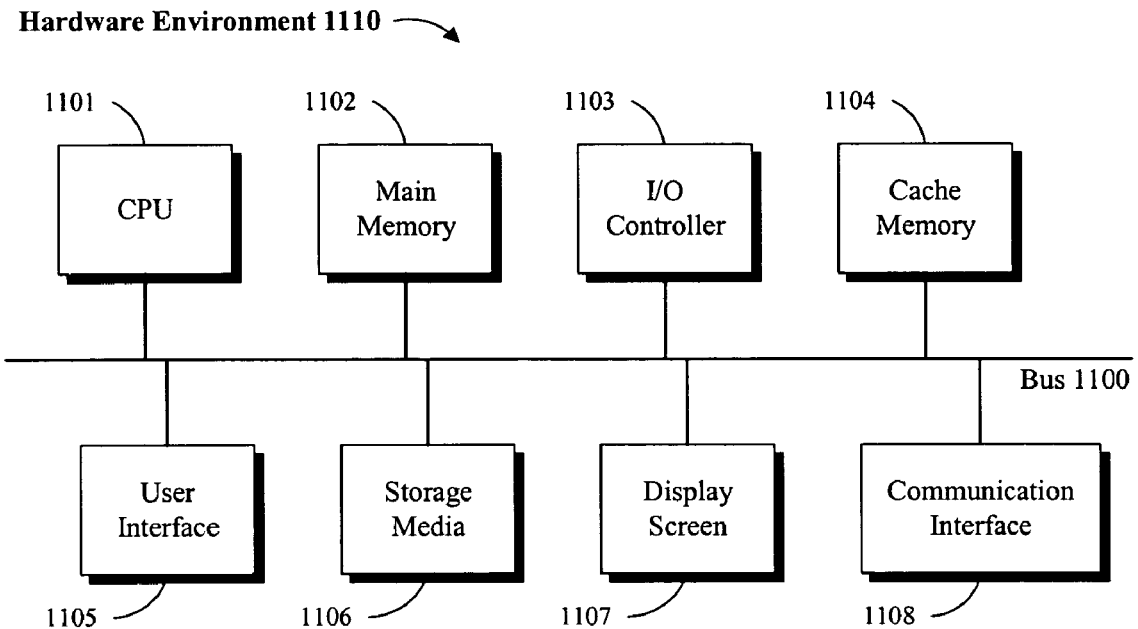
FIGS. 3A and 3B are block diagrams of hardware and software environments in which a system of the present invention may operate, in accordance with one or more embodiments.
Figure 3B:
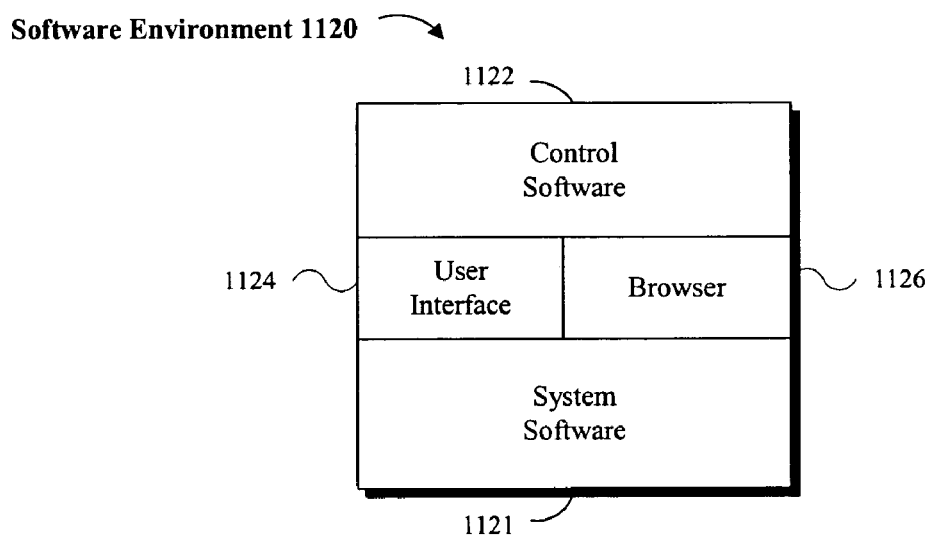

Referring to FIGS. 3A and 3B, in some embodiments, the monitoring, measuring and comparing functions discussed above in relation to control software 1122 are implemented in hardware, or a combination of hardware and software. As such, although control software 1122 is disclosed as applicable to the system of the present invention, this application is by way of example and shall not be construed to limit the scope of the invention to a software solution.

In embodiments of the system, mobile device 100 comprises a controlled system environment that can be presented largely in terms of hardware components and software code executed to perform processes that achieve the results contemplated by the system of the present invention. A more detailed description of such system environment is provided below with reference to FIGS. 3A and 3B.

As shown, a computing system environment is composed of two environments, a hardware environment 1110 and a software environment 1120. The hardware environment 1110 comprises the machinery and equipment that provide an execution environment for the software. The software provides the execution instructions for the hardware. It should be noted that certain hardware and software components may be interchangeably implemented in either form, in accordance with different embodiments of the invention.

Software environment 1120 is divided into two major classes comprising system software 1121 and control software 1122. System software 1121 comprises control programs, such as the operating system (OS) and information management systems that instruct the hardware how to function and process information. Control software 1122 is a program that performs a specific task, such as controlling the audio volume of mobile device 100. In certain embodiments of the invention, system and control software are implemented and executed on one or more hardware environments, for example.

Referring to FIG. 3A, an embodiment of the control software 1122 can be implemented as logic code in the form of computer readable code executed on a general purpose hardware environment 1110 that comprises a central processor unit (CPU) 1101, a main memory 1102, an input/output controller 1103, optional cache memory 1104, a user interface 1105 (e.g., keypad, pointing device, etc.), storage media 1106 (e.g., hard drive, memory, etc.), a display screen 1107, a communication interface 1108 (e.g., a wireless network card, a Blue tooth port, a wireless modem, etc.), and a system synchronizer (e.g., a clock, not shown in FIG. 3A).

Cache memory 1104 is utilized for storing frequently accessed information. A communication mechanism, such as a bi-directional data bus 1100, can be utilized to provide for means of communication between system components. Hardware Environment 1110 is capable of communicating with local or remote systems connected to a wireless communications network (e.g., a PAN or a WAN) through communication interface 1108.

In one or more embodiments, hardware environment 1110 may not include all the above components, or may include additional components for additional functionality or utility. For example, hardware environment 1110 can be a laptop computer or other portable computing device that can send messages and receive data through communication interface 1108. Hardware environment 1110 may also be embodied in an embedded system such as a set-top box, a personal data assistant (PDA), a wireless communication unit (e.g., cellular phone), or other similar hardware platforms that have information processing and/or data storage and communication capabilities. For example, in one or more embodiments of the system, hardware environment 1110 may comprise a PMG unit or an equivalent thereof.

In embodiments of the system, communication interface 1108 can send and receive electrical, electromagnetic, or optical signals that carry digital data streams representing various types of information including program code. If communication is established via a communications network, hardware environment 1110 may transmit program code through the network connection. The program code can be executed by central processor unit 1101 or stored in storage media 1106 or other non-volatile storage for later execution.

Program code may be transmitted via a carrier wave or may be embodied in any other form of computer program product. A computer program product comprises a medium configured to store or transport computer readable code or a medium in which computer readable code may be embedded. Some examples of computer program products are memory cards, CD-ROM disks, ROM cards, floppy disks, magnetic tapes, computer hard drives, and network-server systems.

In one or more embodiments of the invention, processor 1101 is a microprocessor manufactured by Texas Instruments, Qualcomm, Motorola, Intel, or Sun Microsystems Corporations, for example. The named processors are for the purpose of example only. Any other suitable microprocessor, microcontroller, or microcomputer may be utilized.

Referring to FIG. 3B, software environment 1120 or one or more of its components is stored in storage media 1106 and is loaded into memory 1102 prior to execution. Software environment 1120 comprises system software 1121 and control software 1122. Depending on system implementation, certain aspects of software environment 1120, and particularly control software 1122, can be loaded on one or more hardware environments 1110, or subcomponents thereof.

System software 1121 comprises software such as an operating system that controls the low-level operations of hardware environment 1110. Low-level operations comprise the management of the system resources such as memory allocation, file swapping, and other core computing tasks. In one or more embodiments of the invention, the operating system can be Palm, Nucleus, Microsoft Windows, or Macintosh operating systems. However, any other suitable operating system may be utilized.

Control software 1122 can comprise one or more computer programs that are executed on top of system software 1121 after being loaded from storage media 1106 into memory 1102. In a client-server architecture, control software 1122 may comprise client software and/or server software.

Software environment 1120 may also comprise web browser software 1126 for accessing content on a remote server. Further, software environment 1120 may comprise user interface software 1124 (e.g., a Graphical User Interface (GUI)) for receiving user commands and data. The received commands and data are processed by the software applications that run on the hardware environment 1110. The hardware and software architectures and environments described above are for purposes of example only. Embodiments of the invention may be implemented in any type of system architecture or processing environment.

Embodiments of the invention are described by way of example as applicable to systems and corresponding methods for controlling audio volume of a mobile device. In this exemplary embodiment, logic code for performing these methods is implemented in the form of, for example, control software 1122. The logic code, in one embodiment, may be comprised of one or more modules that execute on one or more processors in a distributed or non-distributed communication model. For example, one or more embodiments of the present invention may comprise separate radio and baseband modules, or alternatively modules incorporating the radio, baseband, micro-controller and flash memory in a single-chip solution.

It should also be understood that the programs, modules, processes, methods, and the like, described herein are but exemplary implementations and are not related, or limited, to any particular computer, apparatus, or computer programming language. Rather, various types of general-purpose computing machines or customized devices may be used with logic code implemented in accordance with the teachings provided, herein. Further, the order in which the methods of the present invention are performed is purely illustrative in nature. These methods can be performed in any order or in parallel, unless indicated otherwise in the present disclosure.

The methods of the present invention may be performed in either hardware, software, or any combination thereof. In particular, some methods may be carried out by software, firmware, or macrocode operating on a single computer a plurality of computers. Furthermore, such software may be transmitted in the form of a computer signal embodied in a carrier wave, and through communication networks by way of Internet portals or websites, for example. Accordingly, the present invention is not limited to any particular platform, unless specifically stated otherwise in the present disclosure.

The present invention has been described above with reference to preferred embodiments. However, those skilled in the art will recognize that changes and modifications may be made in these preferred embodiments without departing from the scope of the present invention. Other system architectures, platforms, and implementations that can support various aspects of the invention may be utilized without departing from the essential characteristics as described herein. These and various other adaptations and combinations of features of the embodiments disclosed are within the scope of the invention. The invention is defined by the claims and their full scope of equivalents.

The invention claimed is:

1. A method for adjusting volume of a mobile device in relationship to environment noise when an incoming call is received by the mobile device, the method comprising:
   receiving data communicated to the mobile communication device over a mobile communication network;
   designating a first speaker for audibly producing the data communicated to the mobile device;
   sampling ambient noise around the mobile device to obtain at least one audio sample, wherein the sampling is performed after the mobile device generates a ring in response to receiving an incoming call;
   measuring volume of the ring;
   determining the volume of the ambient noise by reducing a measured volume of the at least one audio sample by the volume of the ring;
   increasing volume of the first speaker, when the volume of the ambient noise is greater than a first threshold value, so that the data communicated to the mobile device can be produced at a higher audible volume, wherein a user predetermines the first threshold value.

2. The method of claim 1 further comprising:
   decreasing the volume of the first speaker, when the volume of the ambient noise is less than at most a second threshold value, so that the data communicated to the mobile device can be produced at a lower audible volume, and wherein the user predetermines the second threshold value.

3. The method of claim 1, wherein the first threshold value represents a first volume beyond which it would be difficult for a user to hear an audio output produced by the mobile device in a first environment.

4. The method of claim 2, wherein the second threshold value represents a second volume above which it would be inappropriate for an audio output of the mobile device to be produced in a second environment.

5. The method of claim 1, wherein the volume of the mobile device is produced by an external speaker of the mobile device.

6. The method of claim 1 wherein the sampling is performed prior to mobile device receiving an incoming call.

7. The method of claim 1 wherein the sampling is performed after mobile device receives an incoming call and before a ring tone is generated by the mobile device.

8. The method of claim 1 wherein the user predetermines a magnitude by which the volume of the first speaker is increased.

9. The method of claim 1, wherein the sampling comprises multiple sampling steps at predetermined time intervals to obtain a plurality of audio samples for the ambient noise.

10. The method of claim 9, wherein the volume of the ambient noise is determined based on the plurality of audio samples obtained.

11. The method of claim 10, wherein the volume of the ambient noise is determined as an average of volumes of the plurality of audio samples obtained.

12. A system for adjusting ring volume of a mobile device when an incoming call is received by the mobile device, the system comprising:
a microphone for obtaining at least one audio sample of ambient noise around the mobile device;
a volume sensor for measuring volume of the at least one audio sample to determine volume of the ambient noise; and
a control mechanism for increasing ring volume of the mobile device, when the volume of the ambient noise is greater than a first threshold value, and for decreasing the ring volume of the mobile device, when the volume of the ambient noise is less than a second threshold value,
wherein a user predetermines the first threshold value and the second threshold,
wherein the user predetermines the magnitude by which the ring volume of the mobile device is adjusted in response to determining the volume of the ambient noise,
wherein the at least one audio sample is obtained after the mobile device generates a ring tone in response to receiving an incoming call; and
wherein the volume of the ambient noise is determined by reducing the measured volume of the at least one audio sample by the volume of the ring tone.

13. The system of claim 12 wherein the at least one audio sample is obtained prior to mobile device receiving an incoming call.

14. The system of claim 12 wherein the at least one audio sample is obtained after the mobile device receives an incoming call and before a ring tone is generated by the mobile device.

15. A system for adjusting speaker volume of a mobile device when an incoming call is received by the mobile device, the system comprising:
a speaker designated for producing audio signals communicated to the mobile device;
a microphone for obtaining at least one audio sample of ambient noise around the mobile device;
a volume sensor for measuring volume of the at least one audio sample to determine volume of the ambient noise; and
a control mechanism for increasing the speaker volume, when the volume of the ambient noise is greater than a first threshold value, and for decreasing the speaker volume of the mobile device, when the volume of the ambient noise is less than a second threshold value, so that the audio signals communicated to the mobile device can be produced at respectively higher and lower audible volumes,
wherein a user predetermines the first threshold value and the second threshold value,
wherein the at least one audio sample is obtained after the mobile device generates a ring tone in response to receiving an incoming call; and
wherein the volume of the ambient noise is determined by reducing the measured volume of the at least one audio sample by the volume of the ring tone.

16. The system of claim 15 wherein the at least one audio sample is obtained prior to mobile device receiving an incoming call.

17. The system of claim 15 wherein the at least one audio sample is obtained after the mobile device receives an incoming call and before a ring tone is generated by the mobile device.

* * * * *